United States Patent
Chan

(10) Patent No.: US 8,637,391 B2
(45) Date of Patent: Jan. 28, 2014

(54) FLIP CHIP SEMICONDUCTOR ASSEMBLY WITH VARIABLE VOLUME SOLDER BUMPS

(75) Inventor: Vincent K. Chan, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 404 days.

(21) Appl. No.: 12/437,027

(22) Filed: May 7, 2009

(65) Prior Publication Data

US 2009/0218689 A1 Sep. 3, 2009

Related U.S. Application Data

(62) Division of application No. 11/467,036, filed on Aug. 24, 2006, now abandoned.

(51) Int. Cl.
*H01L 21/44* (2006.01)

(52) U.S. Cl.
USPC ........... 438/613; 438/610; 257/738; 257/778; 257/780; 257/E21.511; 257/E23.069; 257/E23.07; 228/180.22; 228/189; 228/226

(58) Field of Classification Search
USPC .......... 257/738, 778, 780, E21.508, E21.511, 257/E23.069, E23.07; 438/508, 613, 610, 438/650; 228/180.22, 189, 226
See application file for complete search history.

(56) References Cited

U.S. PATENT DOCUMENTS

| | | | |
|---|---|---|---|
| 5,448,114 A | 9/1995 | Kondoh et al. | |
| 5,569,960 A | 10/1996 | Kumazawa et al. | |
| 5,598,036 A * | 1/1997 | Ho | 257/738 |
| 6,053,394 A | 4/2000 | Dockerty et al. | |
| 6,064,114 A * | 5/2000 | Higgins, III | 257/698 |
| 6,306,683 B1 | 10/2001 | Dery et al. | |
| 6,541,857 B2 | 4/2003 | Caletka et al. | |
| 2004/0262751 A1 | 12/2004 | Lamola et al. | |
| 2007/0205253 A1 | 9/2007 | Hubner | |
| 2007/0257375 A1 * | 11/2007 | Roland et al. | 257/778 |
| 2008/0048321 A1 | 2/2008 | Chan | |

OTHER PUBLICATIONS

Harper, Charles A.; 2005 Electronic Package and Interconnection Handbook, 4th ed. New York: McGraw Hill.

* cited by examiner

*Primary Examiner* — Meiya Li
(74) *Attorney, Agent, or Firm* — Faegre Baker Daniels LLP

(57) ABSTRACT

A method of manufacturing a semiconductor chip is disclosed. A die having a plurality of die-pads is attached to a substrate in a semiconductor package which includes a plurality of substrate-pads. The method involves forming conductive column bumps of differing volumes extending from the die-pads; attaching each of the column bumps to a corresponding substrate-pad to form a subassembly; and reflowing the subassembly so that the column bumps form robust electrical and mechanical connections between the die pads and the substrate pads.

13 Claims, 3 Drawing Sheets

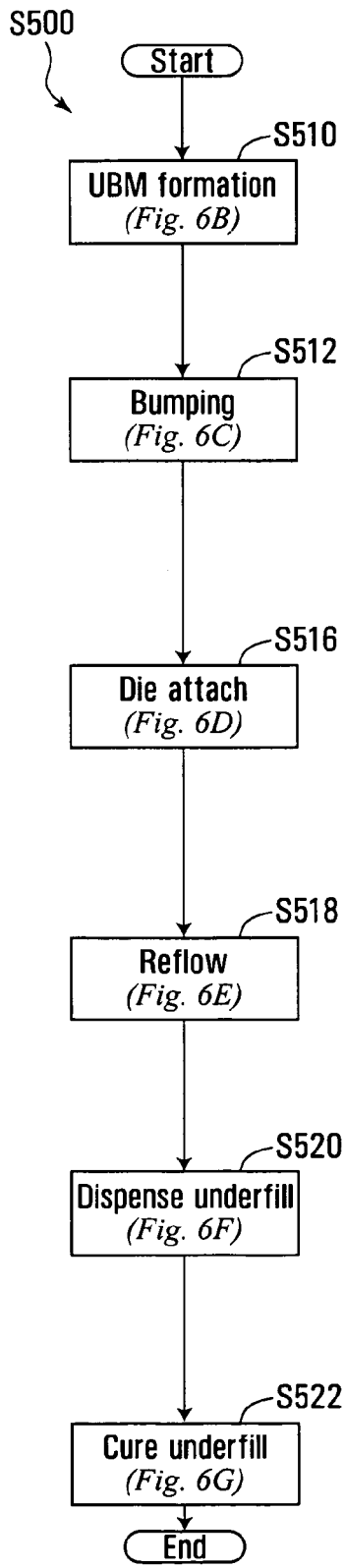
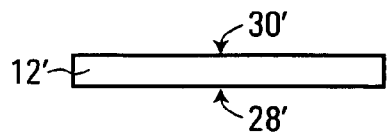
FIG. 6A
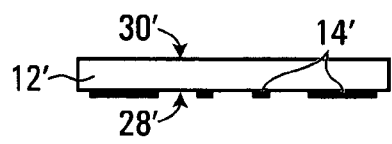
FIG. 6B
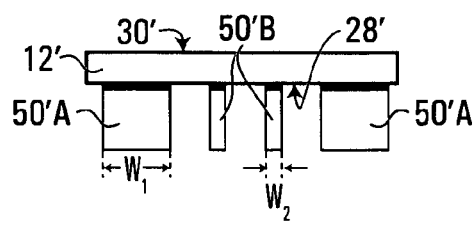
FIG. 6C
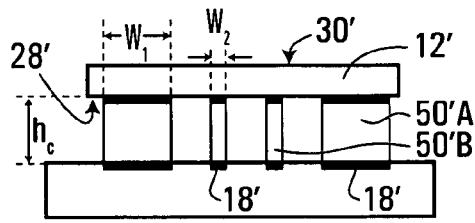
FIG. 6D
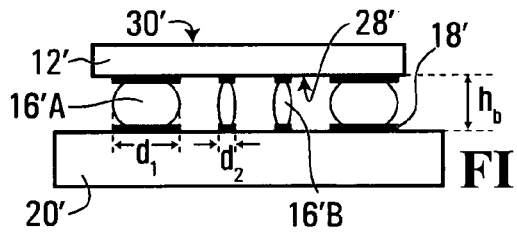
FIG. 6E
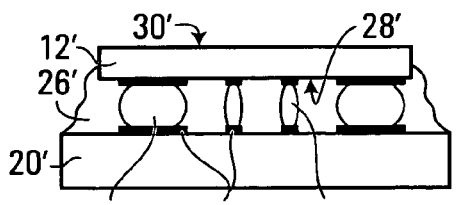
FIG. 6F
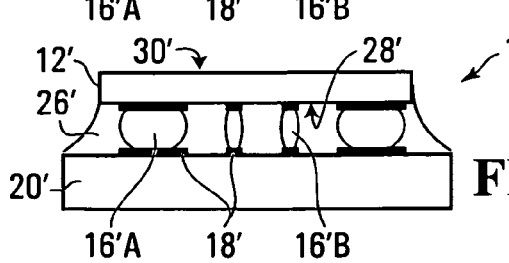
FIG. 6G
FIG. 5

FLIP CHIP SEMICONDUCTOR ASSEMBLY WITH VARIABLE VOLUME SOLDER BUMPS

CROSS-REFERENCE TO RELATED APPLICATIONS

This application is a divisional of co-pending U.S. patent application Ser. No. 11/467,036, filed Aug. 24, 2006, having as inventor Vincent K. Chan, and owned by instant Assignee, the contents of which are hereby incorporated herein by reference.

FIELD OF THE INVENTION

The present invention relates generally to semiconductor chip assembly and more particularly to a semiconductor chip assembly and method of forming a flip chip attachment in a semiconductor chip assembly.

BACKGROUND OF THE INVENTION

Modern semiconductor integrated circuits are formed on an electrical die, which is interconnected to a substrate. Input-output (I/O) pads on one surface of the die, sometimes called die-pads, provide the electrical connection points to the circuit formed in the die. A variety of techniques used to form the electrical and mechanical bond between the die and carrier substrate are known.

The most popular techniques for interconnecting the die to the substrate are wire-bonding and flip chip attachment. In wire-bonding, the die is placed on the substrate with the die pad surface extending away from the substrate. Electrically conductive wires are used to connect the die-pads to substrate-pads (also known as bond-fingers) on the substrate. In flip chip attachments however, electrically conductive column bumps which extend from the die-pads are formed first. These column bumps are then reflowed to form solder balls. The die is then "flipped" so that the surface having the die pad faces the substrate, and the solder balls are attached to substrate-pads on the substrate.

Flip chip attachment techniques were first introduced by International Business Machines Corp. in 1960s. Flip chip attachment techniques have proven advantageous as they generally permit smaller chip packages, and better electrical and thermal performance resulting from shorter connection lengths between die-pads and substrate-pads.

In flip chip attachments, solder joints also provide both an electrical and a mechanical connection of the die to the substrate. This can sometimes be a drawback as solder joints are more susceptible to mechanical stresses which may cause solder joints to fail and electrical paths to be broken.

The die and the substrate often have different coefficients of thermal expansion. This means that when the die is bonded to the substrate using a reflow process, stress is already built into the solder joint of the bumps. When heat is invariably generated during operation of a chip package, the die and the substrate expand at different rates. This causes mechanical stress and solder-fatigue. Individual solders may disconnect from the substrate-pads, which may render the chip package inoperable.

A common technique to reduce the mechanical stress in flip chip attachments is to introduce an encapsulant or an underfill between the die and the substrate. The underfill bonds to both the die and the substrate and lowers the stress on the solder bumps during thermal expansion.

Another approach to minimize the effect of mechanical stress on flip chip attachments is to increase the size of the solder balls so that the cross-sectional area of individual connections is larger and the connections are able to withstand greater mechanical stress they can withstand. However, this requires that all solder balls are larger since the solder balls must be coplanar (i.e., must have the same height) in order to be attached to the bond-fingers reliably. Specifically, differences in solder ball heights would mean that shorter solder balls would fail to make reliable connections to bond-fingers.

This is unfortunate as the distribution of mechanical stress is not uniform across all solder balls. In particular, the mechanical stress on corner solder balls may be significantly higher than on the remaining solder balls. Increasing the size of all solder balls, however, would also decrease the pitch or I/O density for a given die size.

Accordingly, there is a need for a new method of flip chip attachment.

SUMMARY OF THE INVENTION

In accordance with one aspect of the present invention, there is provided a method of manufacturing a semiconductor chip. A die attached to a substrate in a semiconductor package includes a plurality of die-pads, while the substrate includes a plurality of substrate-pads. The method includes forming conductive column bumps extending from the die-pads, with at least two of the column bumps having different volumes; attaching each of the column bumps to a corresponding substrate-pad to form a subassembly; and reflowing the subassembly so that the column bumps form robust electrical and mechanical connections between the die pads and the substrate pads.

In accordance with another aspect of the present invention, there is provided another method of manufacturing a semiconductor chip. The method includes forming a plurality of metallized die-pads extending from a semiconductor die; forming, from a conductive reflowable material, column bumps extending from the metallized, die-pads at least two of the column bumps having different volumes; aligning the column bumps with substrate-pads of a substrate, to place the column bumps in contact with the die-pads, prior to reflowing the column bumps; and reflowing the column bumps on the die-pads to form electrical and mechanical connections between the die-pads and the substrate-pads.

In accordance with yet another aspect of the present invention there is provided a semiconductor chip assembly, including a die having an integrated circuit formed thereon; die pads extending from the die; a substrate; substrate contacts; and reflowed solder balls mechanically interconnecting the die pads to the substrate contacts, wherein at least some of the solder balls have differing volumes.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

FIG. 5 is a flow chart depicting steps of flip chip attachment, resulting in the semiconductor chip package of FIG. 3, and exemplary of an embodiment of the present invention; and FIGS. 6A-6G are sectional views illustrating sub-assemblies at different stages of the flip chip attachment of the method of FIG. 5.

DETAILED DESCRIPTION

Figure 2A:
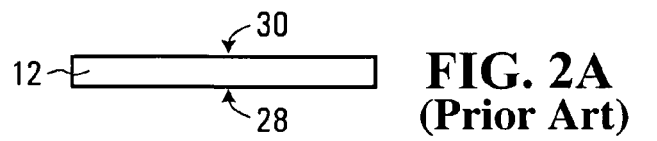
FIGS. 2A-2H are sectional views illustrating different stages of the flip chip attachment assembly of FIG. 1.
Figure 2B:
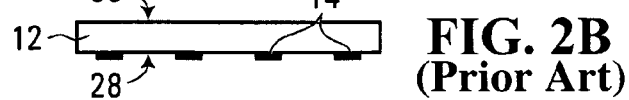
Figure 2C:
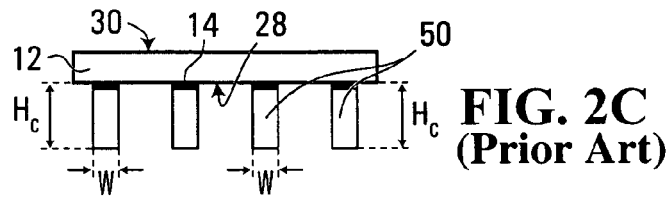
Figure 2D:
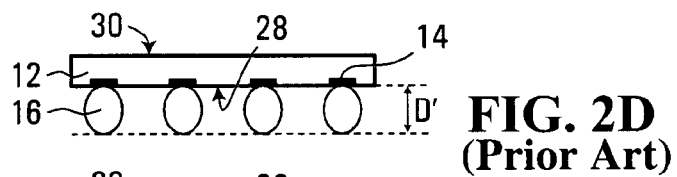
Figure 2E:
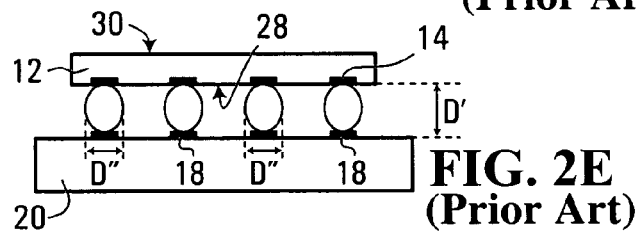
Figure 2F:
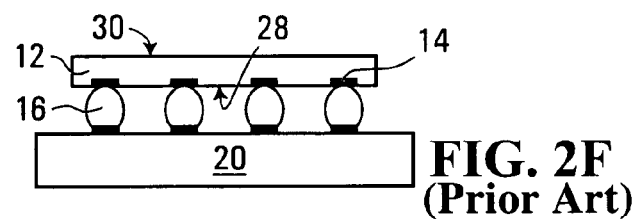
Figure 2G:
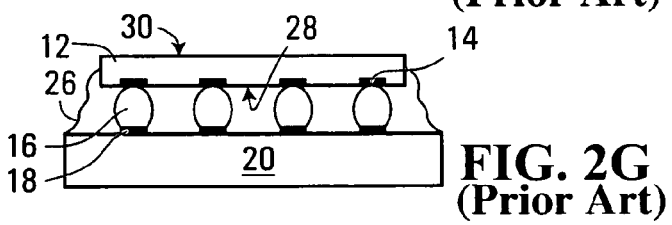
Figure 2H:
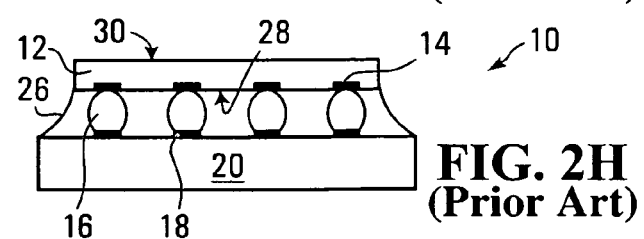
Figure 1:
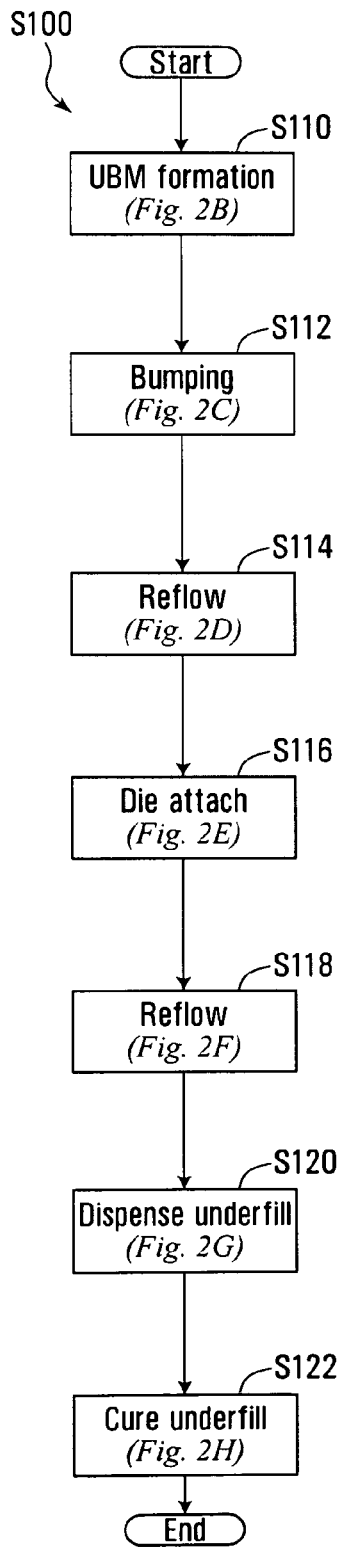
FIG. 1 is a flow chart depicting steps involved in a conventional flip chip attachment.

A conventional semiconductor chip package 10, illustrated in FIG. 2H, may be formed in accordance with steps S100 of FIG. 1. For steps of FIG. 1, corresponding sectional views of resulting subassemblies leading to conventional semiconductor chip package 10 are depicted in FIGS. 2A-2H.

As illustrated in FIG. 2A, a die 12 has an active surface 28, and an opposite inactive surface 30, and an integrated circuit formed therein. Die 12 initially has no interconnections. Die 12 is placed on a substrate 20 with active surface 28 of die 12 facing toward substrate 20.

Under-bump metallization (UBM) 24 is formed on die 10 to form the die/subassembly depicted in FIG. 2B, in step S110. In step S112 bumps or column bumps 50 extending from UBM 24 are formed as depicted in FIG. 2C. As will become apparent, the widths W, the heights $H_c$, and volumes of column bumps 50 should be uniform.

Following the formation of column bumps 50 in step S112, column bumps 50 are reflowed in step S114. Reflowing converts column bumps 50 into solder balls 16, resulting in the subassembly depicted in FIG. 2D. As column bumps 50 are of generally the same volume, resulting solder balls will also be of generally uniform volume. Reflow may be effected by heating in an oven to form solder joints or shape solder bumps.

In step S116, solder balls 16 are aligned with corresponding metal substrate-pads 18 on substrate 20, and attached using a flux compound resulting in the subassembly depicted in FIG. 2E. This attachment forms an electrical connection to metallization layers (not shown) of substrate 20 to provide electrical interconnections between substrate-pads 18 and I/O pins (not shown) of the assembled semiconductor chip package.

To further solidify attachment, balls 16 are reflowed in step S118. This helps form a strong electrical and mechanical bond between die 12 and substrate 20. The resulting subassembly is depicted in FIG. 2F.

In step S120, an underfill 26 is dispensed under die 12 resulting in the subassembly depicted in FIG. 1G. In step S122 underfill 26 is cured. Cured underfill 26 helps lower the stress on the interconnections. The resulting conventional flip chip attached semiconductor assembly 10 is illustrated in FIG. 2H.

At the conclusion of step S114 solder balls 16 (in FIG. 1D) should be uniform and co-planar. In other words the height D' of solder balls 16 in FIG. 2D should be the same for all balls 16. This ensures that the attachment of die 12 to substrate 20 is reliable. Uneven height or diameter (resulting from uneven volumes) of solder balls 16 at the end of step S114 may lead to frail connections or disconnection of some solder balls from substrate-pads when die 12 is attached in step S116. This in turn, may lead to severe problems with the operation of the chip package.

As such, column bumps 50 (FIG. 2C) formed in step S112 should be of uniform height and cross sectional area. If the cross sectional area or height of column bumps 50 is not uniform, then solder balls of different diameters may result after reflow in step S114.

This is a major drawback of conventional flip chip attachment techniques which prevents bumps of different cross sectional areas from being used.

Figure 3:
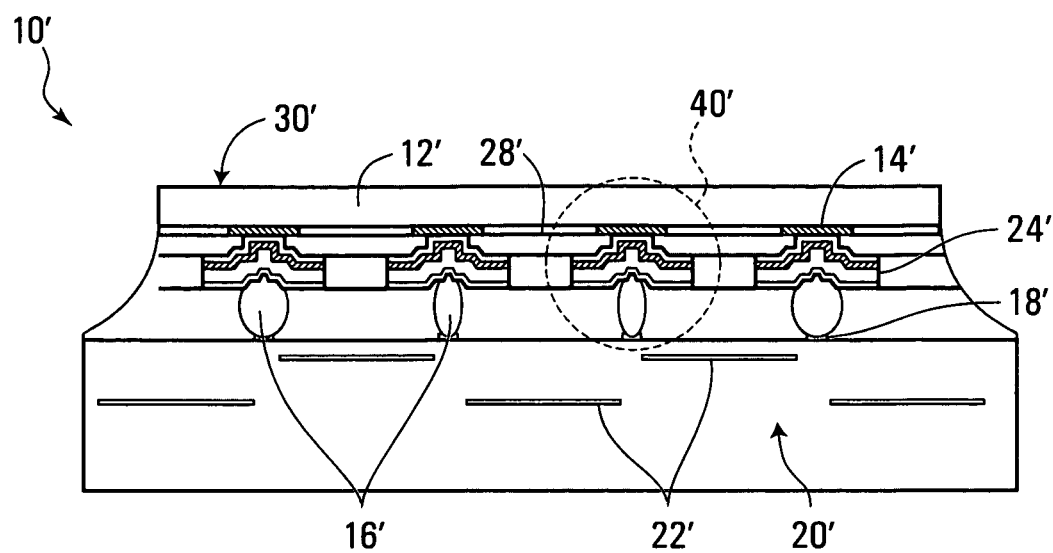
FIG. 3 is a cross sectional view of a semiconductor chip package, assembled in manners exemplary of an embodiment of the present invention.

Accordingly, FIG. 5 shows a flow chart of a method S500 of flip chip attachment resulting in semiconductor chip package 10' illustrated in cross-section in FIG. 3, and exemplary of an embodiment of the present invention.

As illustrated in FIG. 3, semiconductor package 10' includes a die 12' having an active surface 28' with an integrated circuit formed thereon, and an inactive surface 30'. Die 12' is interconnected to a substrate 20' with active surface 28' of die 12' facing toward substrate 20'. Solder balls 16' protrude from die-pads 14' and are attached to substrate-pads or bond-fingers 18' on substrate 20' to form an electrical connection to metallization layers 22'. Metallization layers 22' provide electrical interconnections between substrate-pads 18' and I/O pins (not shown) of semiconductor chip package 10'. An underfill 26', which may be formed of epoxy material, dispensed between die 12' and substrate 20' helps reduce the mechanical stress on solder balls 16'.

For steps of method S500, resulting sub-assemblies are depicted in FIGS. 6A-6G. Thus for each of steps S510, S512, S516, S518, S520, and S522, a resulting intermediate subassembly is as depicted in FIGS. 6B, 6C, 6D, 6E, 6F, and 6G respectively. The numeral labels various parts of subassembly depicted in FIGS. 6A-6G are denoted by a prime (') postfix to distinguish them from similar parts depicted FIGS. 2A-2H.

Initially, die 12', having an integrated circuit formed thereon, has no interconnections as shown in FIG. 6A. In step S510 a UBM 24' is formed. UBM formation in step S510 typically involves deposition of several layers. UBM formation in step S510 may utilize evaporation or sputtering. Evaporation vaporizes a metal compound in a vacuum chamber and resulting in a uniform coating of the wafer. Patterning may be achieved by using physical masks. Alternatively, sputtering involves directed metal ion plasma between an anode and a cathode using a target made from the metal to be deposited. Other processes that may be used are explained in detail in Harper, Charles A. 2005 Electronic Packaging and Interconnection, 4$^{th}$ ed. New York: McGraw Hill, the contents of which are hereby incorporated by reference. In any event, die 12' will have UBM 24' formed on its die-pads at the conclusion of step S510, as depicted in FIG. 6B, and FIG. 4.

Figure 4:
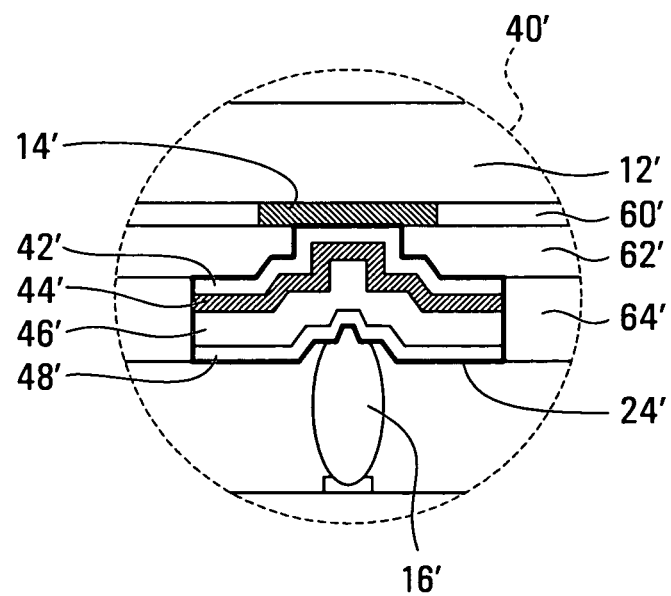
FIG. 4 shows an enlarged view of a portion of FIG. 3.

Specifically, an enlarged view of section 40' of chip package 10' is illustrated in FIG. 4. As illustrated, UBM 24' is formed on die-pads 14' of die 12', thereby metalizing die pads 14' to provide a low resistance electrical connection to solder balls 16'. Die pads 14' may have varying surface areas corresponding to the varying volumes of column bumps that may be formed in subsequent step S512. UBM 24' typically includes several layers. These layers may include an adhesion layer 42', a diffusion barrier layer 44', a solder wettable layer 46' and an optional oxidation barrier (protection layer) 48'. Formation of UBM 24' may include cleaning, insulating oxide removal, and depositing die-pad metallurgy that makes good electrical and mechanical connection to the solder bump, all in step S510. Adhesion layer 42' typically adheres to the metal of die-pad 14' and a surrounding passivation 60'. This provides a strong, low-stress mechanical and electrical connection. Typical adhesion layer materials include chromium (Cr), titanium (Ti), nickel (Ni), tungsten (W) and zincate. Diffusion barrier layer 44' limits the diffusion of solder into the underlying material. Solder wettable layer 46' offers an easily wettable surface to the molten solder during assembly, for good bonding of the solder to the underlying metal. An optional oxidation barrier layer 48' may prevent oxidation of the underlying layers.

In step S512 column bumps 50'A, 50'B (individually and collectively column bumps 50') shown in FIG. 6C, are formed. Solder may be used to form the column bumps. Solders are roughly divided into three types depending on their melting points. The first of these are high temperature solders which typically have melting points above 250° C. These include high-lead solders with compositions of lead (Pb) and tin (Sn) in proportions out of 100 units of 95Pb/5Sn and 97Pb/3Sn. The second type of solders includes those that melt at moderate temperatures, that is between 200° C. and 250° C. These include materials with compositions of 95.5% Sn, 3.5% silver (Ag), and 1.0% Sn. The third type are lower temperature solders that melt at temperatures below 200° C. These include compositions such as 37Pb/63Sn eutectic.

Conveniently, solders with lower melting temperatures may be used to avoid higher temperature that may damage the integrated circuit on die 12' during reflow in step S518. In addition, the semiconductor industry is moving away from high lead content interconnections in semiconductor packages and hopes to eliminate Pb completely by about 2010. Pb makes it difficult to dispose of semiconductor packages in an environmentally safe manner. As such, a solder with low Pb content such as the 37Pb/63Sn eutectic may be used. Alternatively, a lead free solder may be used. Lead free column bumps are typically made from brittle alloys made up of Sn, Ag and copper (Cu) or just Sn and Cu. An exemplary suitable alloy may comprise 96.5% Sn, 3% Ag and 0.5% Cu. The ability to use larger bump sizes thus helps mitigate the effect of using such brittle lead-free bumps.

The deposition of solder material onto UBM 24' may be accomplished by electroplating, printing or evaporation. Printing involves the use of semi-liquid bumps which must be reflowed to become solid. In electroplating, the solder may be electroplated through a photoresist mask to control the volume.

Unlike in the conventional method, the cross-sectional areas, and thus volumes of individual column bumps 50'A, 50'B may be different. In contrast to FIG. 2C, column bumps 50A' and 50'B have different cross-sectional areas and volumes in the subassembly depicted in FIG. 6C. Thus, some column bumps 50'A are larger than others. That is, each one of column bumps 50'A is larger than at least one other column bump 50'. Column bumps 50'A, such as those proximate a corner of die 12', which are likely to experience greater mechanical stress, may be formed so that they have a larger cross-sectional area $W_1$. The ratio of the volumes of largest of solder balls to the smallest may be about 2:1. Alternately, solder balls proximate corners of die 12' may have a volume that is 1.1 times the volume of a solder ball proximate the center. A large or larger column bump is larger than at least one other column bump, while a small or smaller column bump is smaller than at least one other column bump. Similarly a large or larger solder ball is larger than at least one other solder ball, while a small or smaller solder ball is smaller than at least one other solder ball.

Many other considerations may be taken into account in deciding the placement of larger column bumps 50'A. Larger column bumps 50'A may be used to provide greater mechanical and structural stability. For example, if a chip package containing die 12' is to be attached to a board in which one edge of the chip package will be supported by a wall at one end, then larger column bumps 50'A may be placed at the opposite edge to promote structural stability.

Larger column bumps 50'A may also be placed near areas of greatest heat dissipation in die 12' so that heat is conducted away from die 12' more efficiently through larger column bumps 50'A. Here column bumps 50'A act as thermal conduction paths, in addition to providing structural support.

Column bumps 50'A may also be placed to facilitate greater current conduction from die 12'. Other considerations that influence the placement of larger column bumps 50'A include thermo-mechanical stress from thermal expansion of die 12'. In this case it may be advantageous to place larger column bumps 50'A around near areas where the mechanical stress caused by thermal expansion is greatest in die 12'. Many other considerations will be obvious to those of ordinary skill in the art.

In addition to solder bumps, plated bumps such as copper or gold bumps may be used to form column bumps 50'A, 50'B. It may, however, be advantageous to use solder bumps which are cheaper and more easily available in large quantities for mass production.

Once column bumps 50'A, 50'B are formed in step S512, die 12' is attached in step S516 to substrate 20'. As can now be appreciated, no reflow (analogous to step S114 in FIG. 1) exits between forming column bumps (step S512) and die attachment step S516. This contrasts sharply with the conventional process where a reflow step S114 turns column bumps into solder balls.

In step S516, column bumps 50'A, 50'B are directly attached to substrate-pads 18' of substrate 20' as depicted in FIG. 6D. In other words, the subassembly of FIG. 6C is not reflowed, and thus column bumps 50'A, 50'B remain as column bumps (rather than solder balls) when attached to substrate-pads 18' on substrate 20'. Column bumps 50'A, 50'B may be formed on a wafer which is subsequently cut into individual dies before attachment. All column bumps 50'A, 50'B preferably have the same height $h_c$, although their cross-sectional areas may vary. Before attachment, die 12' may be precisely vision-aligned so that the bumps are aligned with their corresponding substrate-pads 18'. A flux compound is applied on the chip site of substrate 20' and to remove oxidation and act as a temporary adhesive prior to reflow. The column bumps 50'A, 50'B may be eutectic solder bumps.

The subassembly is then reflowed in step S518. Reflow may be effected by heating in a reflow furnace to form solder balls 16'A, 16'B (individually and collectively solder balls 16'). Again, some solder balls 16'A are larger than others. That is, each one of solder balls 16'A is larger than at least one other solder ball 16'. Several oven technologies are known in the art including conduction, forced convection, infrared heating and muffle technology. After reflow the eutectic solder will liquefy, wet and react with substrate-pads to form a robust electrical and mechanical connection. The flux material is then preferably cleaned after reflow. Alternately the flux compound may be carefully chosen to be compatible with the underfill and chip passivation.

In step S520 an underfill 26' is introduced. Underfill 26' may be dispensed on one or both sides of the subassembly and allowed to completely fill the gap between die 12' and substrate 20' as shown in FIG. 6F. Examples of suitable underfills include encapsulants provided by Nagase & Co. Ltd. such as Formulated Epoxy Resins.

The assembly, with underfill 26', is placed in a cure oven to cure underfill 26' (FIG. 6G) in step S522. Methods for underfill processing such as those based on capillary flow are well known in the art.

Underfill 26' couples die 12' and substrate 20' along the entire area of the die as shown in FIG. 6G. The composite coefficient of thermal expansion (CTE) of the assembly is thus between that of die 12' and substrate 20', which advantageously lowers the thermo-mechanical stress on the flip chip attached solder balls 16'A, 16'B.

Advantageously, as column bumps 50'A, 50'B need not be reflowed prior to attachment to the substrate 20', the cross-sectional area of individual bumps $w_1$ (for 50A) and $w_2$ (for 50'B) (FIG. 6D) and volumes of balls 16'A, 16'B (FIG. 6E) can be varied without affecting the height $h_c$ of the column bumps 50'A, 50'B. This departs from the conventional process in which the bumps are reflowed prior to attachment, which leads to an undesirable effect in which differing cross-sectional areas of column bumps may lead to the formation of solder balls 16 of different heights (diameters).

Uniform bump height may be maintained by bypassing the reflow step (S114 in FIG. 1 which has no analogous part in FIG. 5) and attaching the column bumps 50'A, 50'B, which have equal heights $h_c$, directly to the substrate 20' as shown in FIG. 6D.

As illustrated in FIG. 6E, this permits solder balls 16'A, 16'B (corresponding to columns 50'A, 50'B respectively) to have different horizontal cross sectional areas $d_1$, $d_2$ respectively while maintaining the same solder ball height $h_b$ after the die attach in step S516 is completed.

In particular, columns that are likely to experience higher mechanical stress after the chip package is mounted onto boards can be made larger (e.g. 50'A in FIGS. 6C-6D) while maintaining smaller cross sectional areas for the rest of the column bumps 50'B to enable high I/O density. Columns at the corners of the die may be made larger to withstand greater mechanical stress. As mentioned, this can be achieved without compromising the pitch of bumps in the interior of the die.

After the reflow in step S518, following die attach in step S516, column bumps 50'A 50'B of different thickness values are turned into solder balls 16'A, 16'B generally of the same height, ($h_b$ in FIG. 6E) but of possibly different horizontal cross sectional areas or diameters ($d_1$, $d_2$ in FIG. 6E). The problem of poor solder joints identified with using bumps of different cross-sectional thickness in the conventional process is thus satisfactorily solved by methods of flip chip attachment in accordance with the steps outlined in the present invention.

Advantageously, methods exemplary of the present invention may reduce the number of steps involved in the flip chip assembly process by eliminating a reflow process (S114 in FIG. 2) without introducing new steps.

Of course, the above described embodiments, are intended to be illustrative only and in no way limiting. The described embodiments of carrying out the invention, are susceptible to many modifications of form, arrangement of parts, details and order of operation. The invention, rather, is intended to encompass all such modification within its scope, as defined by the claims.

What is claimed is:

1. A method of manufacturing a semiconductor chip assembly comprising a die with an integrated circuit formed thereon comprising a plurality of die-pads, and a substrate comprising a plurality of substrate-pads said method comprising:
    (i) forming conductive columns extending from said die-pads, at least two of said columns having different volumes, said conductive columns having equal height, each one of said columns formed substantially of a conductive reflowable material and having a substantially uniform cross-section, prior to reflowing;
    (ii) attaching each of said columns of equal height directly to a corresponding one of said substrate-pads to form a subassembly prior to reflowing said columns; and
    (iii) reflowing said columns of equal height to form solder balls of varying volume to form electrical and mechanical connections between said die-pads and said substrate-pads.

2. The method of claim 1 further comprising, forming under-bump metallization (UBM) on said die-pads before said forming conductive columns.

3. The method of claim 1, further comprising dispensing an underfill between said die and said substrate.

4. The method of claim 3, further comprising curing said underfill.

5. The method of claim 4, wherein said columns are substantially lead free.

6. The method of claim 5, wherein said columns comprise 63% Sn and 37% Pb eutectic, or 96.5% Sn, 3% Ag and 0.5% Cu.

7. The method of claim 1, wherein said columns comprise wire stud bumps.

8. The method of claim 1, wherein said columns are plated.

9. The method of claim 1, wherein each of said conductive columns is formed by at least one of electroplating, printing or evaporation, on a respective substrate pad.

10. A method of manufacturing a semiconductor chip assembly comprising:
    forming a plurality of metallized die-pads extending from a semiconductor die;
    forming, from a conductive reflowable material, columns of equal height and each one of said columns having substantially uniform cross-section, prior to reflow, said columns extending from said metalized die-pads, at least two of said columns having different volumes;
    aligning said columns of equal height with substrate-pads of a substrate, to place said columns in contact with said die-pads, prior to reflowing said columns;
    reflowing said columns on said die-pads to form solder balls of varying volume to form electrical and mechanical connections between said die-pads and said substrate-pads.

11. The method of claim 10, further comprising dispensing an underfill between said die and said substrate.

12. The method of claim 10, wherein said columns are substantially lead free.

13. The method of claim 10, wherein said conductive columns is fowled by at least one of electroplating, printing or evaporation, on a respective substrate pad.

* * * * *

UNITED STATES PATENT AND TRADEMARK OFFICE
CERTIFICATE OF CORRECTION

PATENT NO. : 8,637,391 B2  
APPLICATION NO. : 12/437027  
DATED : January 28, 2014  
INVENTOR(S) : Vincent K. Chan Page 1 of 1

It is certified that error appears in the above-identified patent and that said Letters Patent is hereby corrected as shown below:

In the Claims

In Claim 13, column 8, line 56 "column is fowled" should read --column is formed--

Signed and Sealed this
Second Day of December, 2014

Michelle K. Lee
*Deputy Director of the United States Patent and Trademark Office*